(12) United States Patent
Weber

(10) Patent No.: US 6,244,282 B1
(45) Date of Patent: Jun. 12, 2001

(54) SUBSTRATE TREATMENT DEVICE

(75) Inventor: Martin Weber, Elzach (DE)

(73) Assignee: STEAG MicroTech GmbH (DE)

( * ) Notice: Subject to any disclaimer, the term of this patent is extended or adjusted under 35 U.S.C. 154(b) by 0 days.

(21) Appl. No.: 09/308,105

(22) PCT Filed: Oct. 1, 1997

(86) PCT No.: PCT/EP97/05408

§ 371 Date: May 4, 1999

§ 102(e) Date: May 4, 1999

(87) PCT Pub. No.: WO98/20522

PCT Pub. Date: May 14, 1998

(30) Foreign Application Priority Data

Nov. 4, 1996 (DE) .............................................. 196 45 425

(51) Int. Cl.$^7$ ...................................................... B08B 3/04
(52) U.S. Cl. ........................................... 134/135; 134/902
(58) Field of Search .............................. 134/902, 61, 135

(56) References Cited

U.S. PATENT DOCUMENTS

| | | |
|---|---|---|
| 4,493,333 * | 1/1985 | Layton ............................. 134/902 X |
| 5,369,891 | 12/1994 | Kamikawa . |

FOREIGN PATENT DOCUMENTS

| | | |
|---|---|---|
| 44 13 077 C2 | 10/1995 | (DE) . |
| 195 46 990 C2 | 7/1996 | (DE) . |
| 0 292 090 | 11/1988 | (EP) . |
| 07176509 | 4/1994 | (EP) . |
| 1 265519 | 10/1989 | (JP) . |
| 3 258380 | 11/1991 | (JP) . |
| 4 157724 | 5/1992 | (JP) . |
| 5 129268 | 5/1993 | (JP) . |
| 6 84876 | 3/1994 | (JP) . |
| 07273079 | 10/1995 | (JP) . |

* cited by examiner

Primary Examiner—Philip R. Coe
(74) Attorney, Agent, or Firm—Robert W. Becker & Associates

(57) ABSTRACT

A device for the treatment of substrates has a fluid container filled with a treatment fluid and at least one substrate receiving device. A lifting device is provided for lifting and lowering the at least one substrate receiving device out of and into the treatment fluid. The lifting device is arranged laterally at the container and has parts that are positioned above the container and the treatment fluid. A vapor suction device with a suction channel is provided for exhaustion of vapors in an area in which parts of the at least one lifting device are located above the treatment fluid. In the area above the treatment fluid, a plate is provided having an opening to which the suction channel is connected.

5 Claims, 2 Drawing Sheets

SUBSTRATE TREATMENT DEVICE

BACKGROUND OF THE INVENTION

The invention concerns a device for the treatment of substrates comprising a fluid container filled with a treatment fluid, wherein at least one substrate receiving device and one lifting device for the lifting and lowering of the substrate receiving device is provided, the lifting device arranged laterally at the container and having parts positioned above the container and above the treatment fluid.

Devices of the aforementioned kind are known from DE 44 13 077 A1 and DE 195 46 990 A1 of the applicant of this present patent application and are also described in the German patent applications DE 196 16 402.8, DE 196 15 969.2, DE 196 37 875.3 and DE 195 37 879.2 of the same applicant, which have not been published as of the filing date of this application. In these devices, the lifting device is positioned laterally at the fluid container. The parts of the lifting device that support the substrate receiving devices immersed in the treatment fluid, protrude into an area above the tank and above the treatment fluid. Because the treatment fluid contains chemicals, the vapors of these chemicals are present above the surface of the treatment fluid and, in particular, also in the area of the lifting device. Especially when the lifting device is enclosed by a housing, these vapors accumulate in the area of the lifting device and inside the housing.

The components of the lifting device that are being immersed into the treatment fluid, are coated or covered by a material, for example, plastic, to prevent the contact of the components of the lifting device, commonly comprised of stainless steel or aluminum, with the treatment fluid and the chemicals contained therein that otherwise would corrode the stainless steel or aluminum materials. However, it is not possible that all components of the lifting device outside of the treatment fluid are coated with a protective layer, such as for instance, connections that require a precise assembly with small tolerances or components that are movable relative to one another. At least these parts and surfaces of the lifting device are exposed to the vapor and corroded by it. Therefore, the service life of these lifting devices is short.

From the documents JP 4-157724 A2, JP 1-2655519 A2 and JP 6-84876 A2 devices are known wherein at least one fluid container is completed enclosed in a housing into which clean air is blown in from the top and is removed at the bottom or laterally.

From the documents JP 3-258380 A2, JP 7-273079 A2 and 5-129268 A2 devices are furthermore known that are provided with an air removal or vapor removal suction device.

Based on this, the object of the invention is to improve a device for the treatment of substrates of the aforementioned kind in a way that a longer service life for the lifting device is achieved and the device is protected from chemical vapors.

SUMMARY OF THE INVENTION

The object of the invention is inventively solved by providing a vapor suction device that exhausts the developing vapors, especially in an area in which parts of the lifting device are located above the treatment fluid. This prevents that the aggressive vapors can attack the lifting device and its precisely manufactured and cooperating components and functional elements. To avoid repetition concerning the embodiment of the lifting device and its components and functions, reference is made to the application DE 195 46 990 A1 and DE 196 37 875.3 that are incorporated by reference into the present patent application (the latter application has not been published as of the filing date of this application).

According to a preferred embodiment of the invention, the lifting device is contained within housing. This housing provides the suction area for the vapor suction device and encloses the aforementioned area. The use of a housing particularly increases the risk of damaging chemical vapor not only ingressing and remaining inside the housing, but also of accumulation of the chemical vapor and increased concentration within the housing. In this way, the components of the lifting devices inside the housing are corroded even more and the service life will decrease even more. This is prevented with the features of the invention.

An especially advantageous embodiment of the invention is that the vapor suction device removes the vapors above the surface of the treatment fluid, thus directly at the location where they develop. The removal takes place in the aforementioned area of the lifting device more or less directly above the surface, thus, in particular, in the area above the surface of the treatment fluid, where the housing is positioned.

It is advantageous to provide a planar plate for vapor removal, arranged in the area of the lifting device above the treatment fluid, the plate being connected by an opening to a suction channel of the vapor suction device. To this end, it is ensured that the vapors are exhausted at the location where they develop, i.e. directly above the surface of the treatment fluid. Because the plate in this embodiment is positioned above the surface of the treatment fluid and, advantageously, with only a small distance from the treatment fluid surface, the volume to be exhausted remains small, which, in regard to the expensive reprocessing facilities and procedures necessary for such exhausted air contaminated by vapors, is especially advantageous.

According to another very advantageous embodiment of the invention, a separating element is provided above the surface of the treatment fluid that separates the area of the lifting device from the area for the treatment of the substrates. This embodiment is also beneficial in regard to the vapor suction device having to exhaust only a limited vapor volume while preventing intake of air from areas outside the lifting device area that would increase the volume to be exhausted.

The separating element is preferably embodied as a stay that projects downwardly from the plate provided in the area of the lifting device, in particular, from the side or edge of the plate that faces the inside of the fluid container, and is immersed in the treatment fluid. To this end, a restricted, small volume is defined and contained for the vapor exhaustion in the area of the lifting device with the result that the vapor suction volume remains small.

The vapor exhausted by the vapor suction device is preferably supplied to a reprocessing facility, where the damaging vapors are removed from the air and neutralized.

BRIEF DESCRIPTION OF THE DRAWINGS

The invention is described in the following with the aid of preferred embodiments with reference to the figures. It is shown in.

DESCRIPTION OF THE PREFERRED EMBODIMENTS

Figure 1:
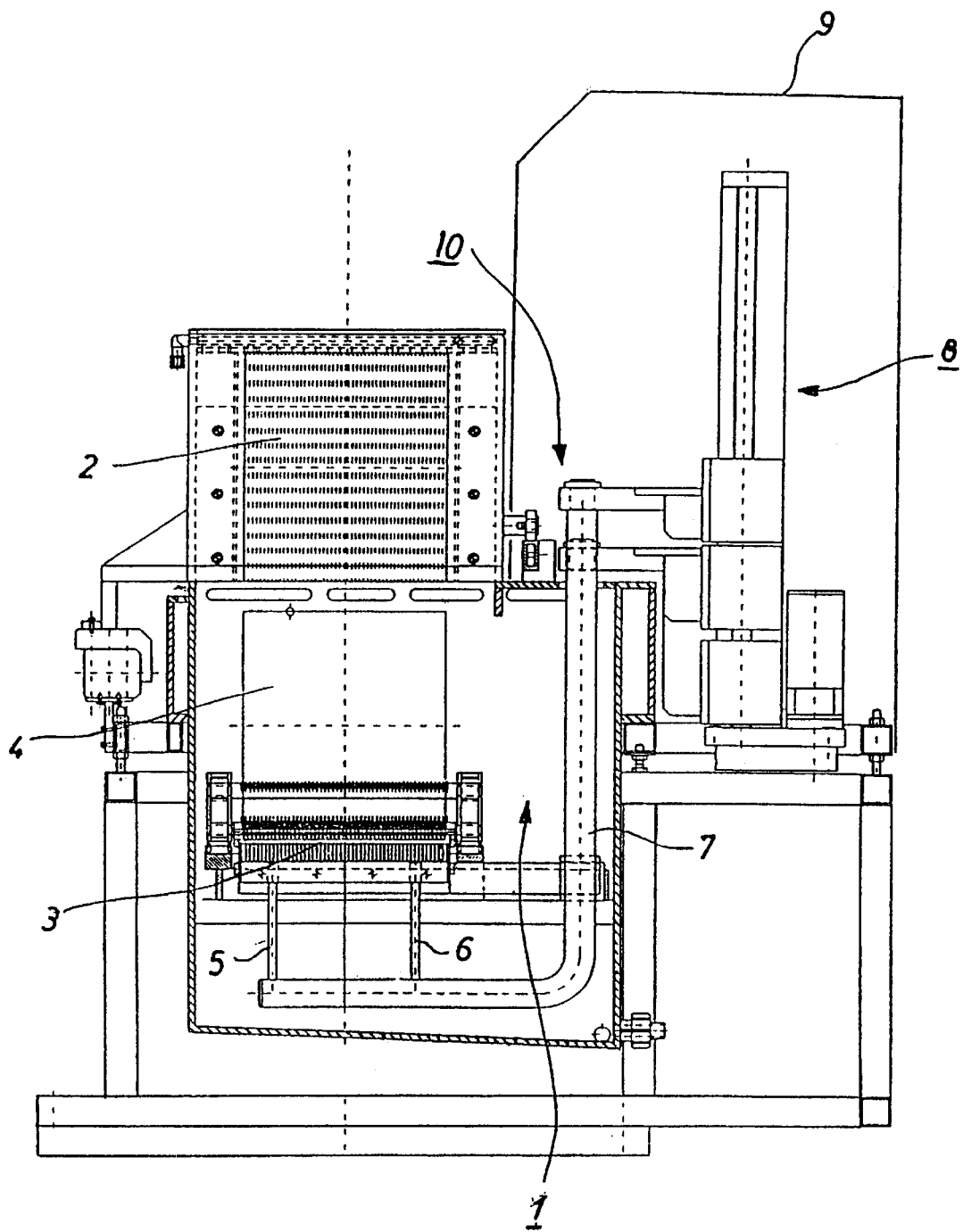
FIG. 1: a schematic cross-section of a device for the treatment of substrates.

FIG. 1 shows a schematic cross section of a device for the treatment of substrates, as shown and described in the German patent application 196 37 875.3 of the same applicant, which has not been published as of the filing date of this application. To avoid repetition concerning the embodiment of this device, reference is made to this application, which is incorporated by reference into the present patent application. The parts of the device shown in FIG. 1 that are necessary for the description and explanation of the vapor suction device, are however described in the following section.

The device shown in FIG. 1 is comprised of a removable hood 2 arranged above a fluid container 1 and a substrate receiving device 3 for supporting a substrate package 4 inside the fluid container 1. The substrate receiving device 3 is connected by mounting elements 5, 6 and a support arm 7 to a lifting device 8 that is surrounded by a housing 9.

The lifting device 8 with differential lift, shown in FIG. 1, is described in DE 195 46 990 A1 of the same applicant. Reference is therefore made to this document which is incorporated by reference into the present patent application to avoid repetition concerning this embodiment.

A housing 9 for the lifting device 8 has a part that is partially protruding past the fluid container 1 to surround also the area 10 of the lifting device situated above the fluid container 1 to which are connected the support arms 7.

The treatment fluid in the fluid container 1 contains chemicals that rise as vapors from the surface of the treatment fluid. For example, a cleaning or rinsing agent commonly contains a small amount of hydrochloric acid that is necessary for dissolving contaminants or particles still adhering to the substrates, e.g., semiconductor wafers. In this case, vapors of hydrochloric acid are forming above the fluid surface. These vapors are not critical in the area of the hood 2, because they are dispersed and suctioned away together with the gas introduced into the hood 2 for the drying process based on the Marangoni principle. To avoid repetition concerning these processes and features, reference is made to DE 44 13 077 A1 or DE 195 46 990 A1 of the same applicant. These chemical vapors are not critical, even without the hood 2, because a device of this kind is usually installed in a clean room with a steady laminar flow from ceiling to floor that would remove the chemical vapors forming in the area of the surface of the treatment fluid.

Very different conditions exist in area 10 of the lifting device above the surface of the treatment fluid. In particular, when the lifting device 8 is enclosed by a housing 9—but even without the housing 9—these vapors will come into contact with the lifting device 8 and its components. Whereas the support arms 7 and all components inside the fluid container 1 are coated with a protective layer against aggressive chemicals, this is not possible outside the fluid container 1, especially for components of the lifting device that are movable relative to one another and/or precision components that require a precise assembly with small tolerances. To avoid repetition, reference is again made to DE 195 46 990 A1.

To prevent the contact of, in some cases, very aggressive chemical vapors, e.g., vapors of hydrochloric acid, with the components of the lifting device 8, that are preferably made of stainless steel or aluminum and are not or cannot be coated with a protective layer, a vapor suction device is inventively provided and described in the following with the aid of FIGS. 2 and 3.

Figure 2:
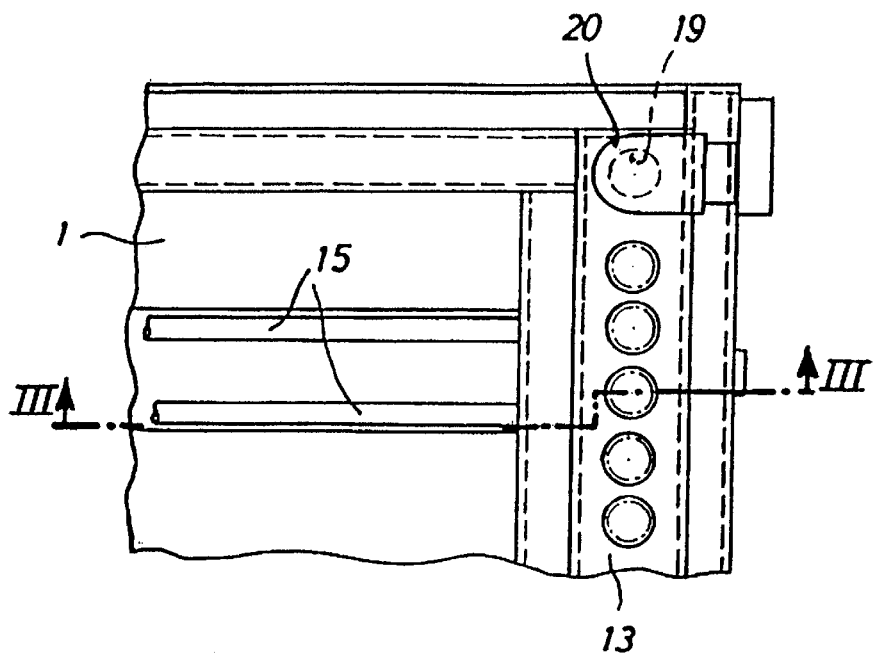
FIG. 2: a schematic partial cross-section of a device shown in FIG. 1 with the area of the lifting device in top view.
Figure 3:
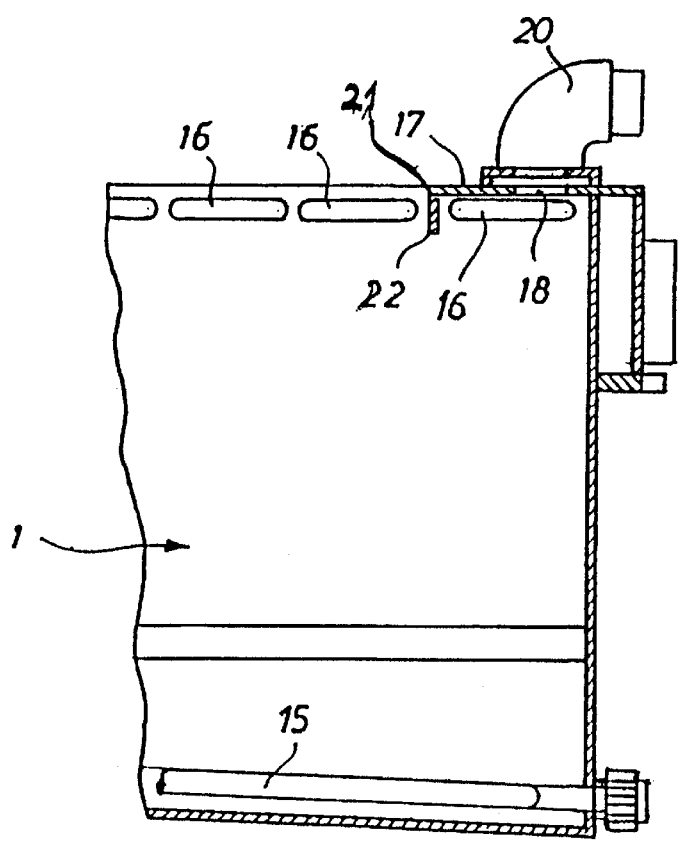
FIG. 3: a cross-section along the section line III—III shown in FIG. 2.

FIGS. 2 and 3 only show the area of the fluid container 1 that contains an area for the fluid treatment and an area 13 with support arms 7. FIG. 2 particularly shows the support arms 7 and their arrangement in the fluid container 1. To avoid repetition, reference is again made to DE 44 13 077 A1 and DE 195 46 990 A1.

As particularly shown in FIG. 3, the treatment fluid flows through an inlet tube 15 into the fluid container 1 and is discharged through overflow slots 16 along the upper edge of the fluid container 1.

On the top of the container, a plate 17 is provided in the area 13 for the support arms 7. It is hollow and contains an opening 18, into which the suction channel 19 opens that is connected by an elbow fitting 20 to a non-represented vacuum source. Hereby, the vapors that are forming in the area of the lifting device 8 above the fluid surface, are exhausted therewith. Because the plate 17 is positioned only a small distance from the fluid surface, the air volume to be exhausted with the chemical vapors contained therein remains small.

From the elongate side or edge 21 of the plate 17 that faces the inside of the fluid container 1, a separating element 22, shaped as a stay, protrudes downwardly from the plate 17 and is immersed in the treatment fluid. The air volume above the fluid surface in the area of the lifting device 8 and/or the housing 9 between the plate 17 and the fluid surface is thus also laterally delimited, so that no air from other areas of the fluid surface is suctioned in and the volume to be exhausted remains small and limited.

The invention has been disclosed with the aid of preferred embodiments. However, persons skilled in the art may be able to implement various alterations, designs and modifications without departing from the gist of the invention. It is, for instance, possible to provide a suction channel 20 not only at one but several points of the suction plate 17. Furthermore, the present invention is not limited to the embodiments of the described treatment and lifting devices for substrates.

The specification incorporates by reference the entire disclosure of German priority documents 196 45 425.5 of Nov. 4, 1996, as well as of International Application PCT/EP97/05408 of Oct. 1, 1997.

The present invention is, of course, in no way restricted to the specific disclosure of the specification and drawings, but also encompasses any modifications within the scope of the appended claims.

What is claimed is:

1. A device for the treatment of substrates (4), said device comprising:

a fluid container (1) filled with treatment fluid (3);

at least one substrate receiving device (3);

a lifting device (8) for lifting and lowering said at least one substrate receiving device (3) out of and into the treatment fluid;

said lifting device (8) arranged laterally at said container (1) and having parts that are positioned above said container (1) and the treatment fluid;

a vapor suction device (17–22) comprising a suction channel (19) for exhaustion of vapors in an area (10) in which parts of said at least one lifting device (8) are located above the treatment fluid; and a housing (9), wherein said lifting device (8) and said parts located above the treatment fluid are surrounded by said housing (9).

2. A device according to claim 1, wherein said vapor suction device (17–22) is provided above the surface of the treatment fluid in said area (10) for exhausting vapors present above the surface in said area (10).

3. A device according to claim 1, further comprising a separating element (22) separating said area (10) above the treatment surface from a surface area below which the treatment of the substrates takes place.

4. A device according to claim 3, wherein said separating element (22) is a vertical stay projecting downwardly from said plate (17) and immersed in the treatment fluid.

5. A device according to claim 1, wherein in said area (10) a plate (17) is provided having an opening (18) to which said suction channel (19) is connected.

* * * * *